United States Patent [19]

Somerville et al.

[11] Patent Number: 5,598,327
[45] Date of Patent: *Jan. 28, 1997

[54] PLANAR TRANSFORMER ASSEMBLY INCLUDING NON-OVERLAPPING PRIMARY AND SECONDARY WINDINGS SURROUNDING A COMMON MAGNETIC FLUX PATH AREA

[75] Inventors: Thomas A. Somerville; Walter B. Meinel; R. Mark Stitt, II, all of Tucson, Ariz.

[73] Assignee: Burr-Brown Corporation, Tucson, Ariz.

[*] Notice: The term of this patent shall not extend beyond the expiration date of Pat. No. 5,353,001.

[21] Appl. No.: 188,159

[22] Filed: Jan. 28, 1994

Related U.S. Application Data

[63] Continuation-in-part of Ser. No. 969,508, Oct. 30, 1992, Pat. No. 5,353,001, and Ser. No. 63,163, May 11, 1993, Pat. No. 5,304,917, which is a continuation-in-part of Ser. No. 850,286, Mar. 12, 1992, abandoned, which is a continuation-in-part of Ser. No. 621,014, Nov. 30, 1990, Pat. No. 5,111,131, said Ser. No. 969,508, is a continuation of Ser. No. 645,224, Jan. 24, 1991, abandoned.

[51] Int. Cl.⁶ .......................... H02M 7/537; H01H 85/02
[52] U.S. Cl. .......................... 363/131; 336/83; 336/96; 336/200; 336/212; 336/232; 29/606
[58] Field of Search .................. 336/200, 212, 336/232, 83, 96; 29/602.1, 606; 363/121

[56] References Cited

U.S. PATENT DOCUMENTS

| | | | |
|---|---|---|---|
| 3,833,872 | 9/1974 | Marcus et al. | 336/83 |
| 4,012,703 | 3/1977 | Chamberlayne | 333/24 R |
| 4,424,504 | 1/1984 | Mitsui et al. | 336/83 |
| 4,506,238 | 3/1985 | Endoh et al. | 333/138 |
| 4,538,132 | 8/1985 | Hiyama et al. | 336/221 |
| 4,628,148 | 12/1986 | Endou | 174/52 PE |
| 4,641,114 | 2/1987 | Person | 333/161 |
| 4,730,241 | 3/1988 | Takaya | 363/19 |
| 4,745,388 | 5/1988 | Billings et al. | 336/192 |
| 4,800,356 | 1/1989 | Ellis | 336/184 |
| 4,864,486 | 9/1989 | Spreen | 363/126 |
| 4,914,561 | 4/1990 | Rice et al. | 363/126 |
| 4,939,494 | 7/1990 | Massuda et al. | 336/96 |
| 5,353,001 | 10/1994 | Meinel et al. | 336/83 |

FOREIGN PATENT DOCUMENTS 54-105729  8/1979  Japan .......................... H01F 27/02

OTHER PUBLICATIONS

IBM Technical Disclosure Bulletin, "Low–Modulus Encapsulation System", by R. Braune, vol. II, No. 8, Jan. 1969, p. 904.

*Primary Examiner*—Jeffrey L. Sterrett
*Attorney, Agent, or Firm*—Cahill, Sutton & Thomas P.L.C.

[57] ABSTRACT

A planar transformer assembly includes an insulative layer, a first spiral winding thereon circumscribing a magnetic flux path, a second spiral winding thereon in non-overlapping relation to the first spiral winding circumscribing the magnetic flux path, and a ferrite core assembly including first and second core sections defining a shallow gap or passage within which the spiral windings are disposed. In one embodiment, a plurality of laminated insulative layers are provided with a primary winding including a plurality of series-connected spiral subwindings and a non-overlapping secondary winding formed on the various insulative layers. The non-overlapping structure and the order of the various windings minimize electric field gradients and thereby minimize electric field coupled noise currents.

22 Claims, 6 Drawing Sheets

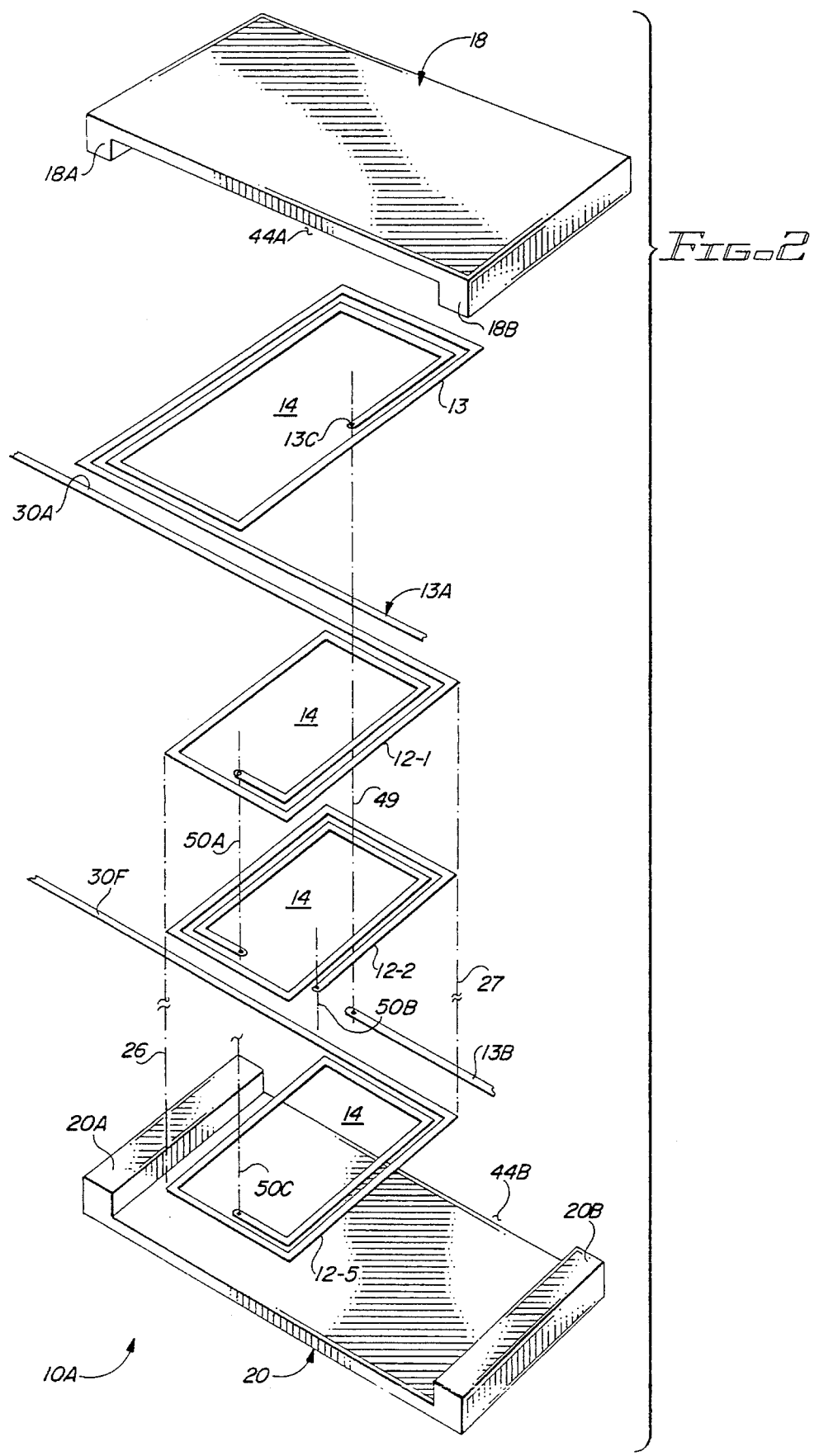

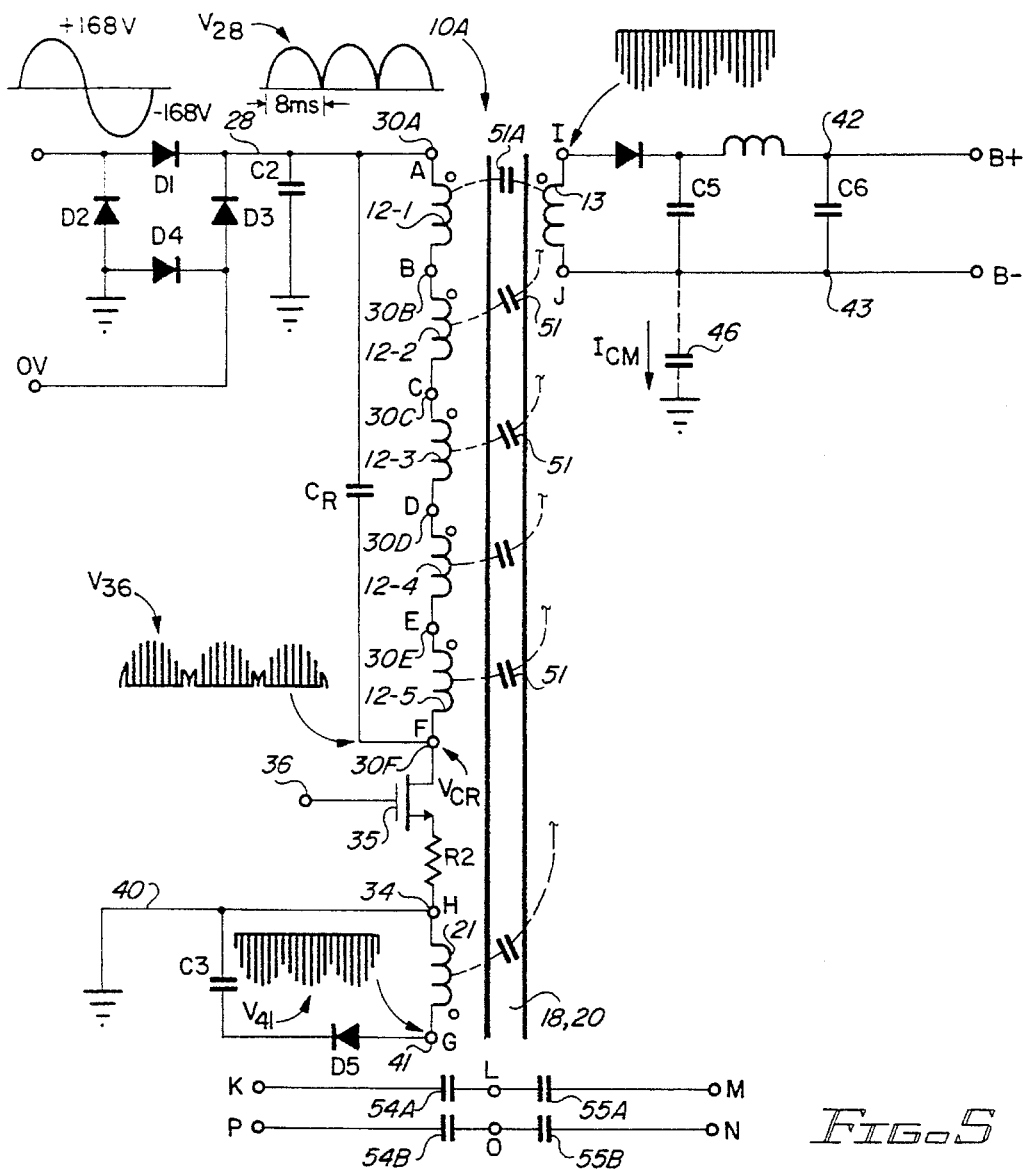
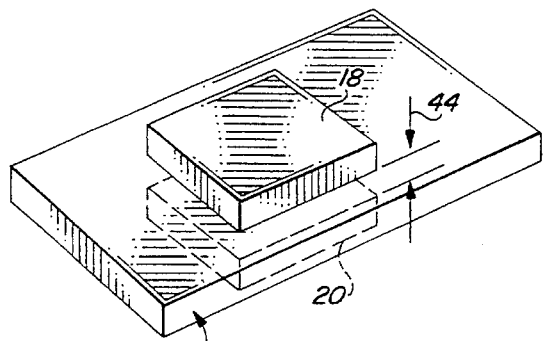
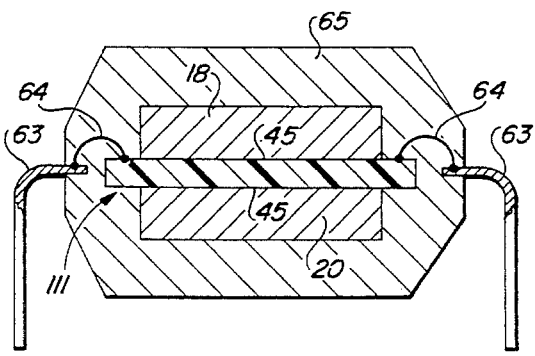
FIG. 5
FIG. 9
FIG. 10

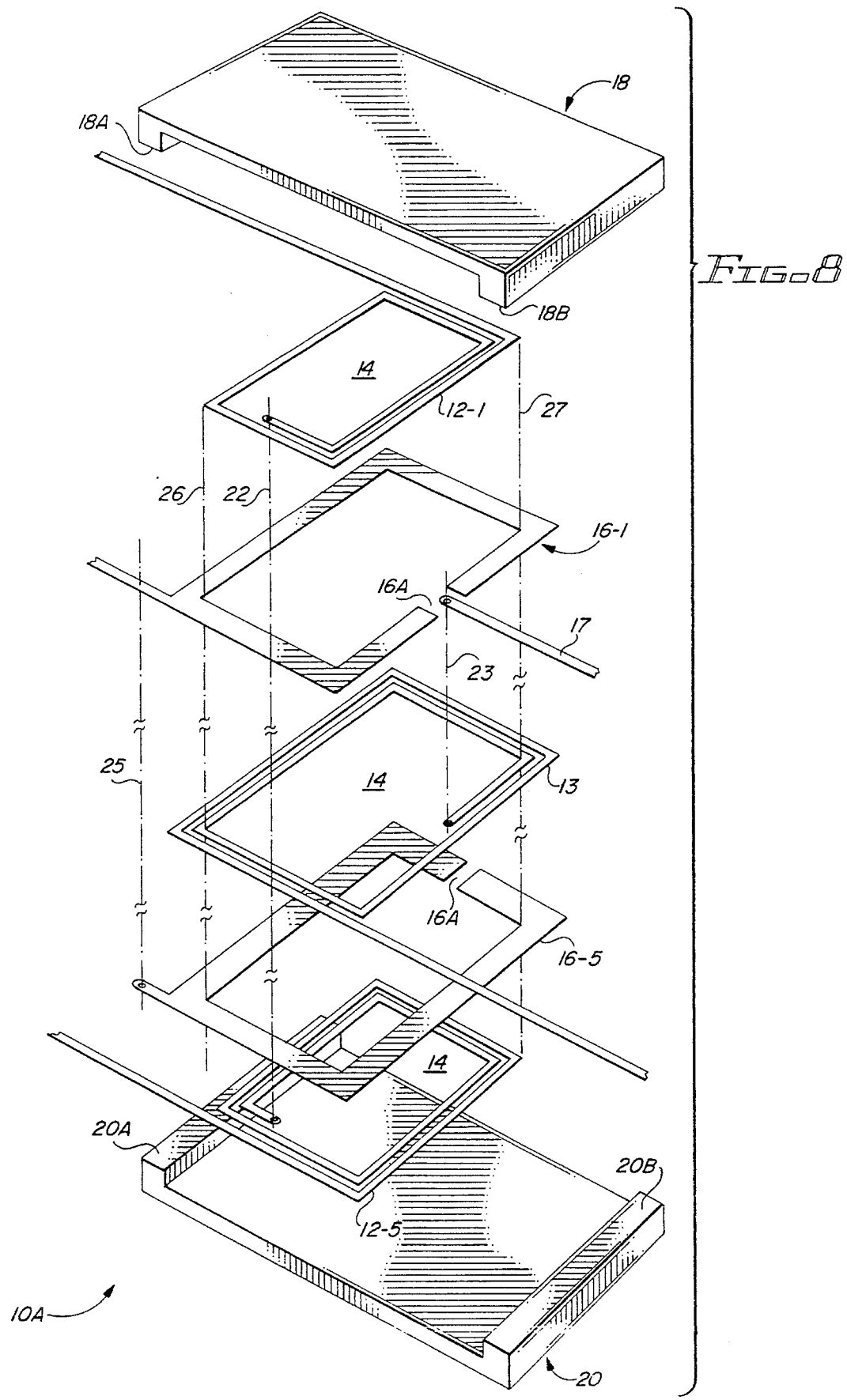

PLANAR TRANSFORMER ASSEMBLY INCLUDING NON-OVERLAPPING PRIMARY AND SECONDARY WINDINGS SURROUNDING A COMMON MAGNETIC FLUX PATH AREA

CROSS REFERENCE TO RELATED APPLICATIONS

This application is a continuation-of-part of commonly assigned applications (1) Ser. No. 969,508, which issued as U.S. Pat. No. 5,353,001 on Oct. 4, 1995, by inventors Walter B. Meinel and Mark R. Stitt entitled "HYBRID INTEGRATED CIRCUIT PLANAR TRANSFORMER" filed Oct. 30, 1992, which is a continuation of application Ser. No. 645,224 filed Jan. 24, 1991, which is now abandoned, and (2) Ser. No. 063,163, by inventor Thomas A. Somerville entitled "COMPACT LOW NOISE LOW POWER DUAL MODE BATTERY CHARGING CIRCUIT", filed May 11, 1993, which is now U.S. Pat. No. 5,304,917 which issued on Apr. 19, 1994 which is a continuation-in-part of application Ser. No. 850,286 filed Mar. 12, 1992, now abandoned, which is a continuation-in-part of application Ser. No. 621,014, filed Nov. 30, 1990, now U.S. Pat. No. 5,111,131 which issued on May 5, 1992.

BACKGROUND OF THE INVENTION

The invention relates to low noise miniature transformers that are useful in hybrid integrated circuits, and more particularly to planar transformers having multiple, series-connected primary windings and a non-overlapping secondary winding imprinted on various layers of a circuit board so as to minimize electromagnetic radiation and electric field coupling between primary and secondary windings, with a ferrite core formed by two ferrite sections, each including a thin, flat plate separated from the other by two spacer sections and also supported by the circuit board.

There are a variety of electronic products which are powered by rechargeable batteries. The functional operation of some electronic products, including some powered by rechargeable batteries, is made unreliable by the presence of electrical noise. FCC regulations limit the amount of electromagnetic interference that can be radiated or conducted to the AC main power line by electronic devices. In some products, the presence of electrical noise causes sounds which are distracting to the user. Portable cellular telephones are an example of a noise-sensitive product. Some such products contain integral battery chargers that convert AC line voltage to low DC voltage levels at which conventional integrated circuit components can operate. It is important that the integral battery charger not introduce sufficient electrical noise to interfere with the reliable operation of the portable cellular telephone, not interfere with other products sharing the charger line voltage, or not violate FCC standards which are applied to electrical products to protect consumers from potential problems. There is an unmet need for a smaller, high efficiency, high frequency, low noise transformer that can be incorporated as part of an AC-to-DC converter or other circuit in a small hybrid integrated circuit package, such as a DIP package, or in a power connecter assembly. Hybrid electronic integrated circuits often are constructed using transfer molded packaging techniques to produce low cost electrical/electronic functions in a single conventional package, such as a dual-in-line package (DIP). Inclusion of magnetic components such as transformers in hybrid integrated circuits has always presented a major challenge, because the transformer cores required usually have large cross-sectional areas. Such large cross-sectional areas are inconsistent with the need to provide circuit functions in small packages.

SUMMARY OF THE INVENTION

Accordingly, it is an object of the invention to provide an improved, reduced size, hybrid integrated circuit transformer that is particularly suitable for low noise applications.

It is another object of the invention to provide a hybrid integrated circuit transformer that can be included on a small printed circuit board as a component of a complete battery charger circuit and is easily encapsulated in a small power connector.

It is another object of the invention to provide a miniature integrated circuit transformer which can be encapsulated within a package having a thickness of as little as approximately 0.2 inches.

It is another object of the invention to provide an improved planar hybrid integrated circuit transformer which can be incorporated in a thin conventional DIP package or the like.

Briefly described, and in accordance with one embodiment thereof, the invention provides a planar transformer assembly including a first insulative layer having a top surface and a bottom surface, a first spiral winding on the top surface, circumscribing a magnetic flux path area, a second spiral winding on the bottom surface circumscribing the magnetic flux path area, generally concentric with the first spiral winding, in non-overlapping relation to the first spiral winding, and a ferrite core assembly including a first core section including a thin, flat first ferrite plate and a second core section including a thin, flat second ferrite plate. In one embodiment an elongated first ferrite spacer section separates first ends of the first and second ferrite plates, and an elongated second ferrite spacer section separates second ends of the first and second ferrite plates. An elongated passage is defined by inner surfaces of the first and second ferrite plates and extends entirely through the ferrite core assembly. The first insulative layer passes entirely through the passage and extends outward from opposite sides of the ferrite core assembly. A securing element clamps the first and second ferrite plates and the first and second end spacer sections together.

In one described embodiment of the invention, a plurality of laminated insulative layers are provided, wherein the first spiral winding is a subwinding of a primary winding including a plurality of series-connected spiral subwindings formed on various surfaces, respectively, of the various insulative layers forming a multi-layer printed circuit board, the spiral subwindings being connected in series by conductive vias passing through the various insulative layers. The second spiral winding is a secondary winding and surrounds the plurality of series-connected spiral subwindings of the primary winding. The secondary winding is formed on a second insulative layer adjacent to the first spiral subwinding. A primary current supply circuit is connected to a first primary winding terminal that is connected to the first spiral subwinding. A switch connected to a second primary winding terminal is operated to produce zero voltage switching of the primary current at a resonant frequency of the primary circuit. This arrangement separates the secondary winding as much as possible from the primary winding terminal on which large flyback voltages occur, reducing electric field gradients and the resulting electromagnetic radiation.

BRIEF DESCRIPTION OF THE DRAWINGS

FIG. 2 is an exploded partial perspective view of a preferred embodiment of the planar transformer of the present invention.

FIG. 5 is a schematic circuit diagram of the planar transformer of FIG. 4 and a resonant primary winding circuit thereof.

FIG. 8 is a partial exploded perspective view of another embodiment of the planar transformer of the invention including conductive shields that contribute to electrically isolating the secondary windings from the primary winding.

FIG. 9 is a perspective view of another embodiment of the planar transformer of the invention.

FIG. 10 is a section view illustrating encapsulation of the embodiment of FIG. 9 in a molded DIP package.

DETAILED DESCRIPTION OF THE PREFERRED EMBODIMENTS

Figure 1:
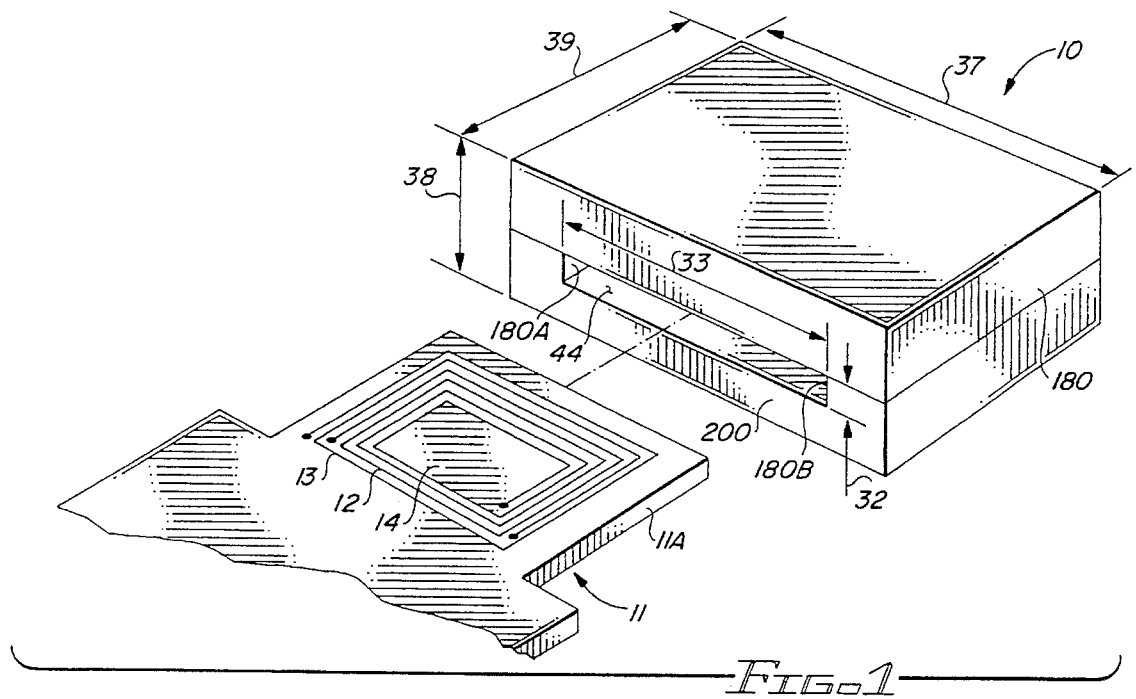
FIG. 1 is a partial perspective view of a planar transformer of the invention.

FIG. 1 shows a partial exploded view of one embodiment of the invention disclosed in the above-identified parent application, Ser. No. 969,508, now U.S. Pat. No. 5,353,001, incorporated herein by reference, in which printed circuit board 11 has a "tongue" section 11A on which windings 12 and 13 are formed generally concentrically, as spiral windings, around a common magnetic flux path area 14. This embodiment of the invention includes a ferrite core structure including an upper section 180 having two post or spacer sections 180A and 180B, one at each end. The two spacer sections 180A and 180B each can have the same width dimension 39 as the upper and lower core half sections 180 and 200. The lower ferrite core half section 200 is a thin flat plate. Spacer sections 180A and 180B are integral with the thin ferrite plate constituting the lower part of ferrite core half section 180.

Core half sections 180 and 200 thereby form a shallow, rectangular passage 44, the height of which is 0.025 inches, as indicated by arrows 32. The width 33 of passage 44 is 0.73 inches. The total thickness of the ferrite core thus formed is 0.305 inches, its length is 1.0 inches, and its width is 0.63 inches, as indicated by dimension lines 38, 37, and 39, respectively. By making the cross-sectional areas of plates 180 and 200 thin and wide, the necessary inductance of typically 800 microhenrys for primary winding 12 is achieved, and the cross-sectional areas are made large enough to keep the magnetic flux density low enough to prevent saturation of the core material. Power loss due to saturation of the core is thereby avoided. The tongue section 11A of printed circuit board 11 with all of the spiral windings printed thereon extends into rectangular hole 44. The width 39 of ferrite core 180, 200 completely subtends or confines all of the generally concentric windings 12, 13, etc. Note that the core 180,200 also could be formed of a single block of ferrite material with hole 44 milled out.

Figure 7:
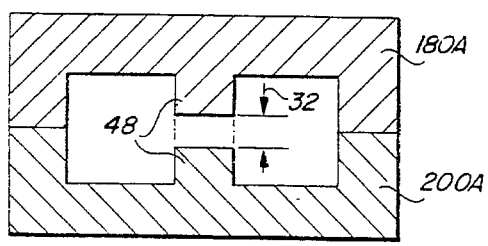
FIG. 7 is a section view diagram useful in explaining one aspect of the invention.

The structure shown in FIG. 1 can be thought of as having a gap 32 of 0.025 inches in the ferrite core 180,200. Gap 32 can be thought of as a gap in the center post of a "E" shaped ferrite core half section 180A,200A as a "limiting case" shown in FIG. 7, where the lengths of the center posts 48 are zero. That is, in the embodiment of FIG. 1, the post structure can be considered to be "infinitely shallow" so the lengths of such posts is zero. In the embodiment of FIG. 1 magnetic flux passes through gap 32 in the center magnetic flux area 14 of the primary and secondary windings, causing mutual inductive coupling therebetween.

Figure 3:
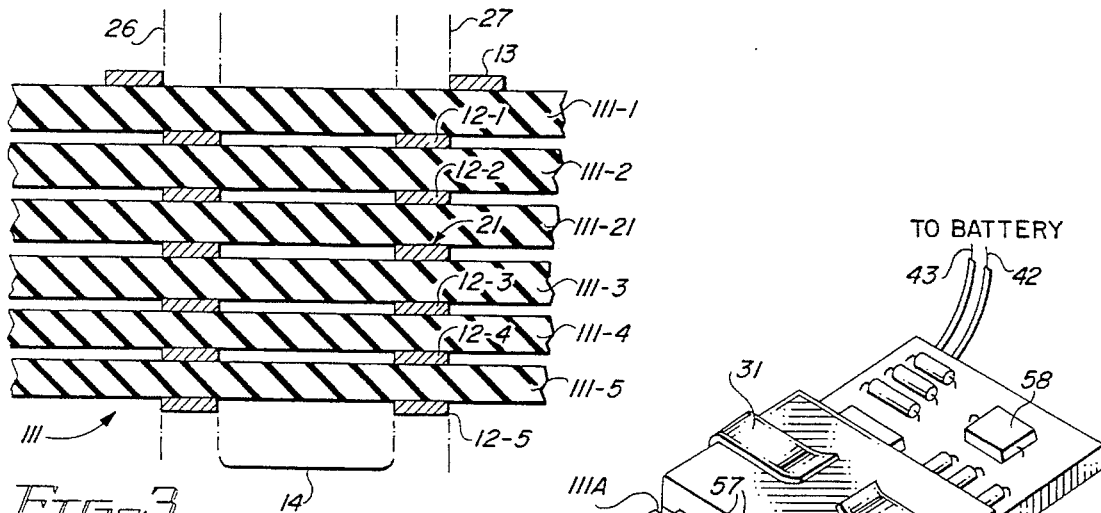
FIG. 3 is a partial section view of the planar transformer of FIG. 2.

FIG. 2 shows a partial exploded view of a preferred embodiment of the planar transformer 10A, with the various insulating layers of a multi-layer printed circuit board 11 omitted for clarity. However, FIG. 3 shows a partial section view of six insulative layers 111-1 . . . 111-5 and 111-21 of a printed circuit board 111 (See FIG. 4) that extends entirely through the passage 44A,B defined by upper core 18 and lower core 20 in FIG. 2. (Note that identical or similar reference numerals are used to designate corresponding parts in the embodiment of FIG. 1 and the embodiment of FIGS. 2–4.)

Referring to FIGS. 2 and 3, upper core section 18 includes a thin flat plate having enlarged, downwardly extending end spacer portions 18A and 18B which abut similar enlarged and upwardly extending end spacer portions 20A and 20B of an essentially identical bottom core section 20. Core sections 18 and 20 can be composed of H63B ferrite material, available from FDK America, Inc., of Irving, Tex. The length and width of each of core section 18 and 20 are 1.0 inches, and 0.63 inches respectively. The thickness of the central portion of each core section is 0.135 inches and the thickness of the enlarged end sections is 0.162 inches. The dimensions of the gap 44A,B defined by upper core section 18 and lower core section 20 are 0.73 inches by 0.63 inches by 0.054 inches.

Primary winding 12 includes five series-connected primary subwindings 12-1 . . . 12-5 (only three of which are illustrated in FIG. 2, for convenience) and an auxiliary primary winding 21 (see FIGS. 3 and 5) which can be formed on the various surfaces of printed circuit board layers 111-1 . . . 111-5, respectively. Each of the five primary subwindings, which are collectively referred to by numeral 12, is generally coextensive with the others, so that they precisely overlap as indicated by dashed lines 26 and 27. One terminal of each of the primary subwindings 12-1, 12-2 etc. is connected to a terminal of another of the primary subwindings on an adjacent layer by a conductive via such as 50A, 50B or 50C. Each of the primary subwindings 12-1, 12-2 etc. circumscribes or surrounds an inner flux path region 14. The terminals of primary winding 12 are designated by numerals 30A and 30F. As shown in FIGS. 2 and 3, secondary winding 13 is formed on the top surface of printed circuit board layer 111-1 and is precisely aligned in a non-overlapping fashion with the five primary subwindings 12. The outer end of secondary winding 13 constitutes terminal 13A, and the inner end 13C is connected by conductive via 49 to metal trace 13B which constitutes the other secondary winding terminal. The inner portion of secondary winding 13 is generally coextensive with the outer portion of each of the five primary subwindings 12. The auxiliary power winding 21 is formed on the upper surface of insulative layer 111-21 (FIG. 3).

Figure 4:
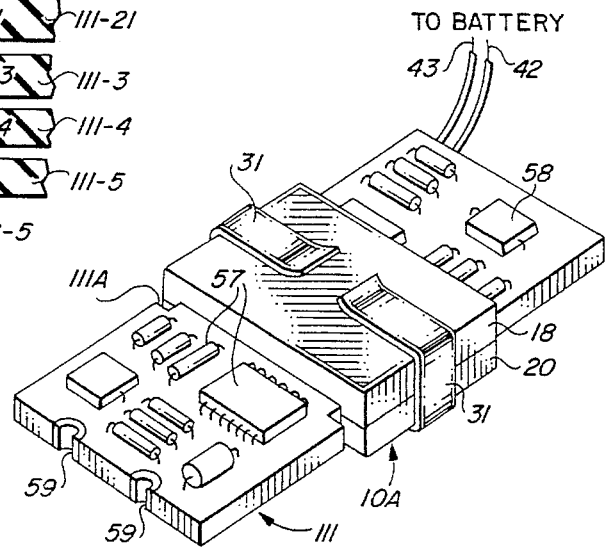
FIG. 4 is a perspective view of the planar transformer of FIG. 2 showing portions of the printed circuit board extending from opposite sides of the ferrite core and carrying associated circuitry.

As shown in FIG. 4, a slightly narrowed portion 111A of printed circuit board 111 on which primary winding 12 and secondary winding 13 are formed extends entirely through the gap 44A,44B defined by the inner surfaces of upper core section 18 and lower core section 20 and the enlarged spacer portions 18A,B and 20A,B. Numerals 57 and 58 generally designate various components, including some of the components indicated in FIG. 5 on the left and right portions of printed circuit board 111 extending beyond the opposed sides of core sections 18 and 20.

Core sections 18 and 20 are clamped together by a pair of inwardly biased spring clips 31. The entire assembly, including printed circuit board 111 and planar transformer 10A thereon, then is inserted in a suitable "package", for example, an enlarged housing for a male electrical plug, with conductors 42 and 43 leading to a rechargeable nickel cadmium battery in a mobile telephone unit or the like which is powered by the male electrical plug. Complete details of a "smart" battery charger circuit on printed circuit board 111 are set forth in U.S. patent application Ser. No. 063,163 filed May 11, 1993 and entitled "COMPACT LOW NOISE LOW POWER DUAL MODE BATTERY CHARGING CIRCUIT" which is incorporated herein by reference. Suitable potting material and/or features of the inside of the package prevent spring clips 31 from coming loose, e.g., as a result of vibration. Conductors 59 engage two prongs, respectively, of the male electrical plug, and are connected to supply household current to the input of the battery charger formed by printed circuit board 111 and planar transformer 10A thereon.

FIG. 8 shows another diagram similar to FIG. 2, in which a plurality of conductive shields 16-1 . . . 16-5 are disposed between the five primary subwindings 12 and the one secondary winding 13, and are generally coextensive with the turns of secondary winding 13. Each shield has a narrow gap 16A to prevent flow of eddy currents, and a lead connected by the other shield leads by a suitable via, indicated by dotted line 25. The shields leads are electrically connected to a low impedance conductor carrying an AC ground voltage.

The initial prototypes of the invention included shields such as 16-1 . . . 16-5. Surprisingly, however, it was discovered that when they are eliminated, the electrical noise or interference, which results partly from coupling between the primary subwindings 12 and secondary winding 13, nevertheless is acceptably low to meet the specifications for which a marketable product is being designed.

As explained in detail in the above-mentioned Somerville application, optimum overall circuit performance is obtained by combination of the planar transformer shown in FIGS. 2 and 3 and a resonant primary circuit as described in the above-identified Somerville application Ser. No. 063,163, especially if the turn off times of MOSFET 35 are adjusted in accordance with changes in the inductance of the primary subwindings 12-1 . . . 12-5 occurring as a result of changes in the loading of the secondary winding 13. This results in reduced power dissipation in MOSFET 35 in FIG. 5 and also ensures that the fly-back voltage $V_{CR}$ returns to zero before MOSFET 19 is turned on, ensuring that "zero voltage switching" is achieved despite variations in the inductance of the primary winding 12 caused by varying load conditions. This substantially reduces the generation of noise harmonics and the like.

FIG. 5 is a simplified schematic diagram that shows the arrangement of the battery charger of the above-identified Somerville application Ser. No. 063,163. The components most closely related to the resonant primary circuit of the planar transformer 10A are shown. More specifically, the series connections of primary subwindings 12-1 . . . 12-5 and the location of secondary winding 13 are shown in FIG. 5. Switching MOSFET 35, a full wave rectifier D1-4, isolation barrier capacitors 54A,55A and 54B,55B also are shown. The auxiliary primary winding 21 used to generate power for circuitry on the primary side of planar transformer also is shown.

In the circuit of FIG. 5, the 110 volt 60 hertz line current is rectified by the full wave rectifier including diodes D1, D2, D3 and D4 to produce the waveform $V_{28}$ on conductor 28, which is connected to terminal 30A of primary winding 12. The other terminal 30F of primary winding 12 is connected to the drain electrode of MOSFET 35 and one terminal of flyback capacitor $C_R$. Terminal 30A of primary winding 12 also is connected to the other terminal of flyback capacitor $C_R$ on which the 120 hertz full wave rectified signal is produced. The flyback voltage $V_{CR}$ occurs on conductor 30F. MOSFET 35 is turned on and off at a 500 kilohertz to 1 megahertz rate, so that primary winding 12 is energized only for a part of the time which is centered about the times of occurrence of the peak levels of the voltage waveform on conductor 28. A feed-back loop such as described in U.S. Pat. No. 5,111,131 involving primary winding 12 adjusts the "on" time of MOSFET 35 to achieve a relatively constant primary winding current level. The primary winding 12 has a smaller average inductance during heavy loading of the secondary winding than during light loading. Accordingly, the off time of MOSFET 19 is adjusted to be less during high current loading conditions than during low current loading conditions, reducing power dissipation in the primary winding because the magnetic flux has time to return to zero for each cycle of the primary winding resonant circuit.

In the presently preferred embodiment of the invention, isolation barrier capacitors as described in U.S. Pat. No. 5,111,131 couple control signals produced by circuitry on the output or secondary winding side of printed circuit board 111 to the input circuitry on the input or primary winding side of printed circuit board 111. In FIG. 5, a pair of capacitors 54A,55A are connected in series to provide one isolation barrier, and capacitors 54B and 55B are connected in series to form another isolation barrier. This pair of isolation barriers is used to convey control information from the secondary side of planar transformer to the primary side thereof.

Figure 6A:
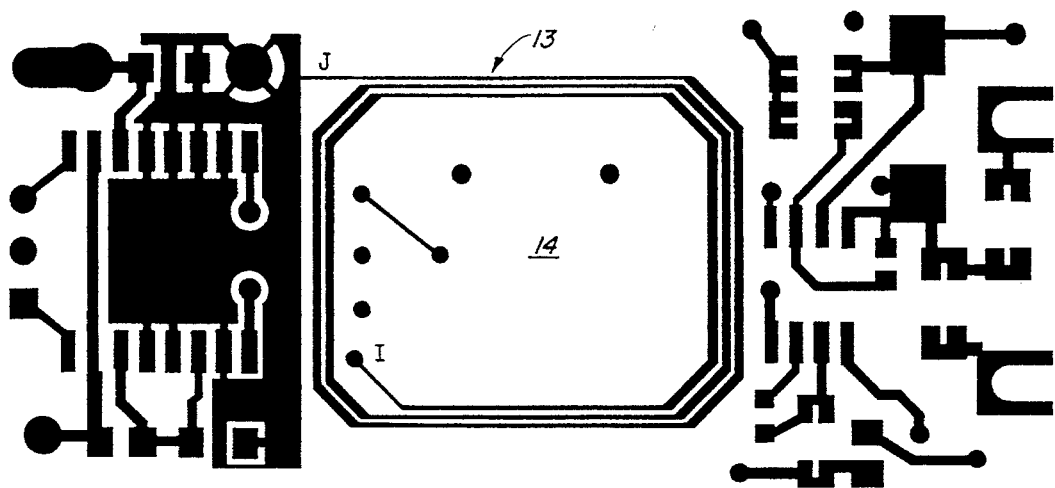
FIGS. 6A–G are scale copies of the metal traces on each of the layers of the printed circuit board of the embodiment of FIG. 5.
Figure 6B:
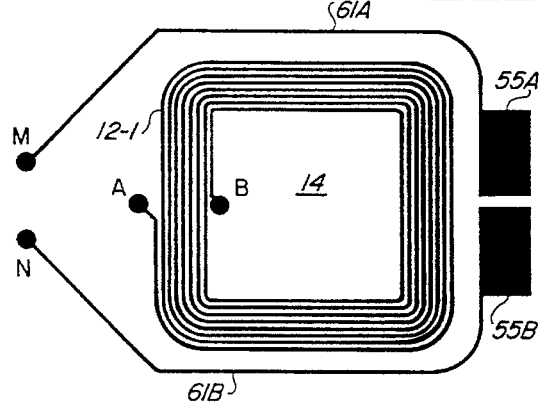
Figure 6C:
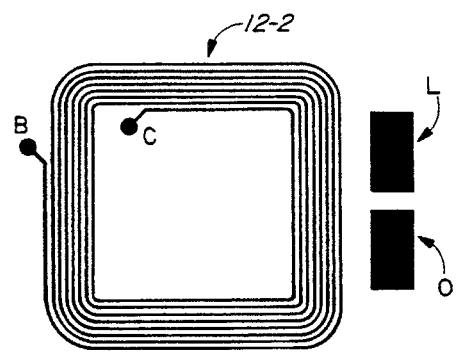
Figure 6D:
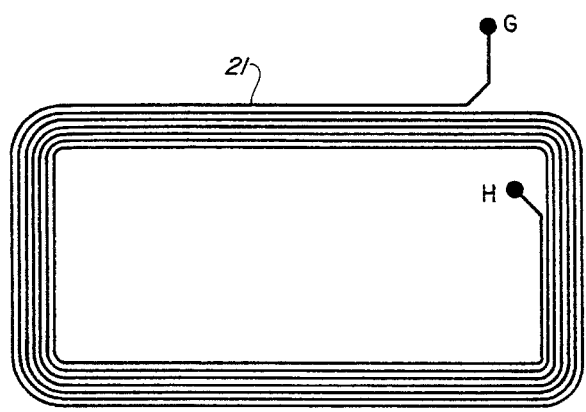
Figure 6E:
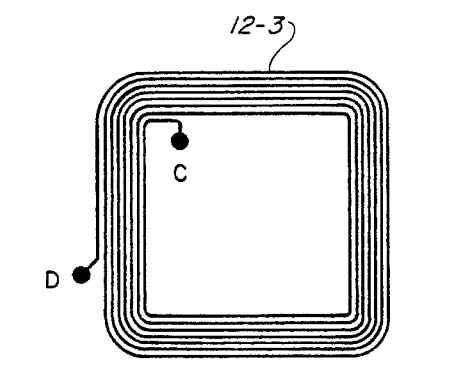
Figure 6F:
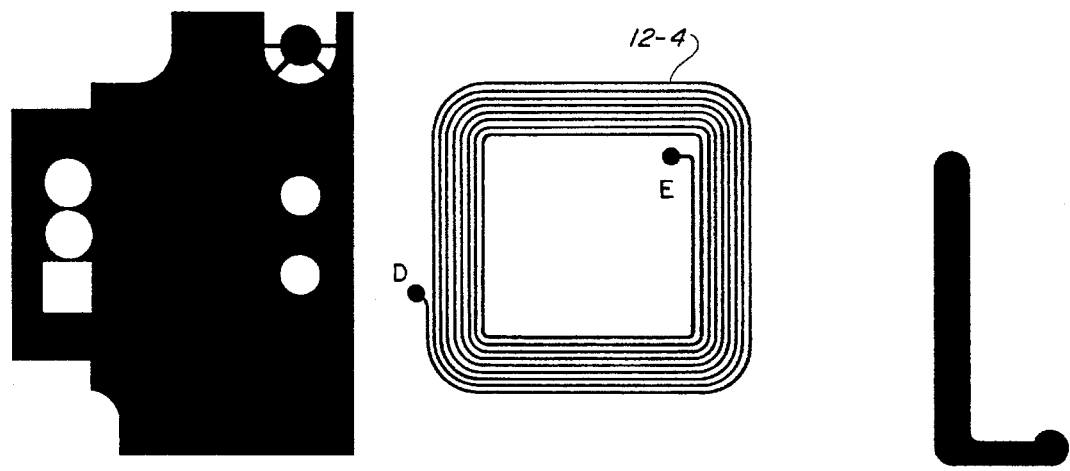
Figure 6G:
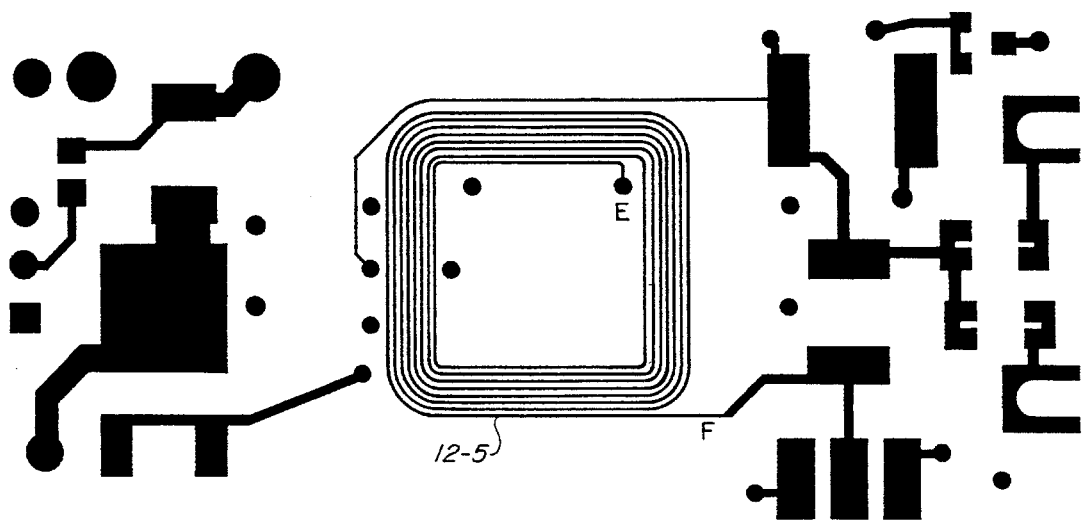

FIGS. 6A–6G show scale views of the various patterns of printed circuit board 111 fabricated to implement the various planar transformer windings and subwindings (including the additional primary winding transformer 21 which rectifies the primary current to produce a power supply signal utilized to power the circuitry on the primary winding side of planar transformer 10A) connected in the order shown in FIG. 5. More specifically, FIG. 6A shows the pattern for secondary winding 13, which appears on top of the top layer 111-1. FIG. 6B shows the pattern for primary subwinding 12-1, and also shows one pair of plates of isolation barrier capacitors 55A and 55B and their leads 61A and 61B to the secondary winding circuitry. Note that the leads 61A and 61B pass outside of the region 14 of concentrated magnetic field flux. FIG. 6C shows the primary subwinding pattern for primary winding 12-2 and also shows two of "floating" isolation barrier capacitor plates which are provided to meet UL regulations unrelated to the present invention. FIG. 6D shows the pattern for auxiliary primary winding 21. FIG. 6E shows the pattern for primary subwinding 12-3. FIG. 6F shows the pattern for primary subwinding 12-4. FIG. 6G shows the pattern for primary subwinding 12-5.

For primary winding 12, the largest AC voltage is the flyback voltage $V_{CR}$, which has peaks of approximately 500 volts. It occurs on primary terminal conductor 30F, and the smallest voltage changes, with peaks of approximately 167 volts, occur on primary terminal conductor 30A. Therefore, in accordance with the present embodiment of the invention, secondary winding 13 is provided on the printed circuit board layer adjacent to primary subwinding 12-1 on which the smallest voltage changes occur. This causes the physical location of secondary winding 13 to be separated by the maximum possible distance from conductor 30F on which the largest AC voltage peaks of approximately 500 volts occur. This minimizes the electric field gradients between primary winding 12 and secondary winding 13, and therefore reduces electromagnetic noise generation and also reduces the likelihood of current leakage or voltage breakdown between primary winding 12 and secondary winding 13. In accordance with the present invention, the parasitic capacitances 51 between primary subwindings 12-1 ... 12-5 and secondary winding 13 are minimized by the illustrated non-overlapping structure. This further minimizes electromagnetic noise generation.

In some applications, especially if printed circuit board 111 is very thin, the end spacer portions 18A and 18B and 20A and 20B shown in FIG. 2 can be omitted, in which case the gap 44A,B extends over the entire length and width of the upper and lower ferrite core sections 18 and 20. FIG. 9 shows such an implementation of the planar transformer, in which upper core section 18 is adhesively or otherwise attached to the upper surface of printed circuit board 111, and lower ferrite core section or plate 20 is adhesively or otherwise attached to the bottom surface of printed circuit board 111.

In FIG. 10, numerals 45 designate adhesive attachment of ferrite cores 18 and 20 to the top and bottom surfaces of printed circuit board 111. Gap 44 is equal to the thickness of printed circuit board 111 and extends throughout the entire region between upper core section 18 and lower core section 20. The printed primary winding and secondary winding, and also a shield similar to that described with reference to FIG. 8, can be provided on layers of printed circuit board 111 between ferrite core sections 18 and 20 in the manner previously described. This embodiment of the invention has lower inductance than the previously described embodiments of the invention, but will be suitable for some applications.

The planar transformer of FIG. 9 has several advantages, one being that it is more compact, as the ends of ferrite cores sections 18 and 19 need not extend around opposed edges of the printed circuit board 111. Another advantage is that gap 44 can be thinner, precisely equal to the thickness of the printed circuit board 111, whereas in the embodiments of FIGS. 1 and 2 the gap 44A,B must be slightly greater than the thickness of the printed circuit board because a small amount of clearance tolerance is needed to ensure that the end sections 18A,B and 20A,B properly abut. Furthermore, it is more convenient to adhesively attach ferrite core sections 18 and 20 to the surfaces of printed circuit board 111 in the planar transformer of FIG. 9 than in the earlier described embodiments.

Another important advantage of the planar transformer of FIG. 9 is that it can be more conveniently encapsulated in a molded DIP package, as shown in FIG. 10, wherein numeral 65 designates the plastic injection-molded body of a DIP package in which the planar transformer and associated printed circuit board 111 are encapsulated. Numeral 63 designates the leads of the DIP, and numeral 64 designates conventional wire bonds of leads 63 to wire bond pads (not shown) on a surface of printed circuit board 111. Magnetostrictive forces produced by ferrite core sections 18 and 20 can be absorbed by the material of which printed circuit board 111 is constructed, avoiding associated power loss and stresses on the DIP body material 65. Problems associated with leakage of the injected molding material between the surfaces of printed circuit board 111 and the inner surfaces of ferrite core sections 18 and 20 are avoided.

Thus, a very small, efficient hybrid integrated circuit transformer with low core losses and low electromagnetic interference is achieved by the above described invention.

While the invention has been described with reference to several embodiments thereof, those skilled in the art will be able to make various modifications to the described embodiments without departing from the true spirit and scope of the invention.

What is claimed is:

1. A planar transformer assembly comprising in combination:

(a) an insulative layer having a top surface and a bottom surface;

(b) a first spiral winding on the top surface, surrounding a magnetic flux path area;

(c) a second spiral winding on the bottom surface, surrounding the magnetic flux path area, concentric with the first spiral winding, in non-overlapping relation to the first spiral winding;

(d) a ferrite core assembly including
   i. a first core section including a thin, flat first ferrite plate disposed on the top surface and subtending the first and second spiral windings, and
   ii. a second core section including a thin, flat second ferrite plate disposed on the bottom surface and subtending the first and second spiral windings.

2. The planar transformer assembly of claim 1 wherein the insulative layer includes a plurality of insulative sublayers, the first spiral winding being disposed on a first insulative sublayer, the second spiral winding being disposed on a second insulative sublayer, the planar transformer assembly including a conductive shield disposed between the first and second insulative sublayers and surrounding the magnetic flux path area and generally coextensive with one of the first and second spiral windings to reduce capacitive coupling between the first and second spiral windings and thereby reduce noise generation during operation of the planar transformer assembly.

3. The planar transformer assembly of claim 2 wherein the guard ring includes a gap to interrupt field coupled currents in the guard ring, and wherein the guard ring is coupled through a low impedance to a fixed voltage.

4. The planar transformer assembly of claim 1 wherein a portion of the insulative layer extends beyond the first and second core sections.

5. The planar transformer assembly of claim 4 including adhesive attaching the first core section to the top surface and adhesive attaching the second core section to the bottom surface.

6. The planar transformer assembly of claim 4 including an elongated first ferrite spacer section separating first ends of the first and second ferrite plates, and an elongated second ferrite spacer section separating second ends of the first and second ferrite plates, and material securing the first and second ferrite plates in fixed relation to the insulative layer.

7. The planar transformer assembly of claim 6 wherein the material includes an elastic clip engaging the first and second core sections to clamp them together.

8. The planar transformer assembly of claim 6 wherein the first ferrite spacer section includes abutting first and second parts integral with the first ends of the first and second ferrite plates, respectively, and the second ferrite spacer section includes abutting third and fourth parts integral with the second ends of the first and second ferrite plates, respectively.

9. The planar transformer assembly of claim 8 wherein the insulative layer includes a plurality of laminated insulative sublayers, wherein the first spiral winding is a subwinding of a primary winding including a plurality of series-connected spiral subwindings formed on various surfaces, respectively, of the various insulative sublayers, the spiral subwindings being connected in series by conductive vias passing through the various insulative sublayers.

10. The planar transformer assembly of claim 9 wherein the second spiral winding is a secondary winding all turns of which surround a region within which all turns of the subwindings of the primary windings are disposed.

11. The planar transformer assembly of claim 10 wherein the sublayers are laminated together to form a multilayer printed circuit board, the planar transformer assembly including a primary current supply circuit disposed on the printed circuit board and connected to a first terminal of the primary winding, and also including a switching circuit disposed on the printed circuit board and connected to a second terminal of the primary winding.

12. The planar transformer assembly of claim 11 wherein the primary supply circuit supplies a relatively low first frequency rectified line voltage to the first terminal of the primary winding and the switching circuit couples and decouples the second terminal of the primary winding to a current return path at a relatively high second frequency equal to a resonant frequency of a primary winding circuit including a flyback capacitor, the second frequency being much greater than the first frequency.

13. The planar transformer assembly of claim 12 wherein the first frequency is approximately 60 hertz and the second frequency is approximately 500 kilohertz to one megahertz.

14. The planar transformer assembly of claim 12 wherein the information controls the switching circuit causing it to adjust the amount of time during which the second terminal of the primary winding is decoupled from the current return path in accordance with the amount of current loading of the secondary winding by the secondary load circuit so as to ensure zero-voltage switching of the primary winding despite changes in inductance of the primary winding caused by variations in the current loading of the secondary winding, thereby reducing noise generation of the planar transformer assembly.

15. The planar transformer assembly of claim 11 wherein the first terminal of the primary winding is connected to a first subwinding thereof, and wherein the secondary winding is disposed on a top insulative sublayer adjacent to another insulative sublayer on which the first subwinding is disposed, and wherein the second terminal of the primary winding is connected to a second subwinding thereof disposed on a bottom insulative sublayer, whereby the secondary winding is substantially separated from the second subwinding, to thereby reduce electrical field gradients and resulting electromagnetic radiation in the planar transformer assembly.

16. The planar transformer assembly of claim 15 wherein the primary winding has a predetermined number of turns in order to achieve a predetermined inductance, and wherein the number of subwindings is selected to allow a diameter of the primary winding to be small enough that all of the predetermined number of turns can be contained within the region surrounded by the turns of the secondary winding.

17. The planar transformer assembly of claim 15 including first and second isolation barrier capacitors adapted to couple information between a secondary load circuit coupled to a terminal of the secondary winding and an input of the switching circuit, wherein conductive plates of each of the first and second isolation barrier capacitors and electrical conductors connected thereto are formed on various laminated insulative layers outside of a magnetic flux path area surrounded by the primary and secondary windings.

18. A method of achieving reduced noise generation in a planar transformer assembly including a multilayer printed circuit board having a plurality of insulative layers, the method comprising the steps of:

(a) forming a secondary winding by forming a first spiral winding surrounding a flux path area on a surface of a first insulative layer, (b) forming a primary winding having first and second terminals by forming a plurality of subwindings on a plurality of insulative layers, respectively, and connecting the subwindings in series by means of conductive vias, the first terminal being adapted to receive a supply line voltage, the second terminal being adapted to be coupled to a switching circuit, all turns of the primary winding being contained in a region surrounded by the secondary winding, whereby the primary winding and secondary winding are non-overlapping and thereby reduce capacitive coupling and thereby reduce harmonic noise generation during operation of the planar transformer assembly.

19. The method of claim 18 wherein the secondary winding has a predetermined secondary winding inductance, the method including selecting the number of subwindings so that a predetermined number of primary winding turns necessary to produce a predetermined primary winding inductance all can be included in the region surrounded by the secondary winding.

20. The method of claim 18 wherein the first insulative layer is adjacent to a second insulative layer, the method including forming one of the subwindings connected to the first terminal on the second insulative layer, and forming another of the subwindings connected to the second terminal on a third insulative layer, the first and third insulative layer being adjacent to opposite faces of the printed circuit board to thereby separate the secondary winding as much as possible from the second terminal, whereby voltage gradients between the primary and secondary windings are reduced and therefore generation of noise due to such gradients is reduced.

21. The method of claim 18 including supplying the line voltage as a rectified line voltage at a relatively low first frequency and operating the switching circuit to couple and decouple the second terminal to a current return path at a relatively high second frequency approximately equal to a resonant frequency of a primary winding circuit to provide improved transformer efficiency and further reduced harmonic noise generation.

22. The method of claim 21 including measuring information indicative of an amount of current loading of the secondary winding, coupling that information to the switching circuit, and operating the switching circuit in response to the information to adjust an amount of time during which the second terminal of the primary winding is decoupled from the current return path in accordance with the amount of current loading of the secondary winding so as to ensure zero-voltage switching of the primary winding despite changes in inductance of the primary winding due to variations in the current loading of the secondary winding, thereby reducing noise generation of the planar transformer assembly.

* * * * *